United States Patent [19]
Fredrickson et al.

[11] Patent Number: 5,280,489
[45] Date of Patent: Jan. 18, 1994

[54] TIME-VARYING VITERBI DETECTOR FOR CONTROL OF ERROR EVENT LENGTH

[75] Inventors: Lyle J. Fredrickson, Sunnyvale; Razmik Karabed, San Jose, both of Calif.; James W. Rae, Rochester, Minn.; Paul H. Siegel; Hemant K. Thapar, both of San Jose, Calif.; Roger W. Wood, Gilroy, Calif.

[73] Assignee: International Business Machines Corporation, Armonk, N.Y.

[21] Appl. No.: 869,570

[22] Filed: Apr. 15, 1992

[51] Int. Cl.$^5$ .................... G06F 11/20; H03M 13/12
[52] U.S. Cl. ........................ 371/45; 371/43; 371/44
[58] Field of Search .................. 371/43, 44, 45, 30

[56] References Cited

U.S. PATENT DOCUMENTS

| | | | |
|---|---|---|---|
| 4,888,775 | 12/1989 | Karabed et al. | 371/43 |
| 4,888,779 | 12/1989 | Karabed et al. | 371/43 |
| 4,945,538 | 7/1990 | Patel | 371/43 |
| 5,068,859 | 11/1991 | Collins et al. | 371/43 |
| 5,095,484 | 3/1992 | Karabed et al. | 371/30 |
| 5,214,672 | 5/1993 | Eyuboglu et al. | 375/34 |

OTHER PUBLICATIONS

C. B. Shung et al, "Area-Efficient Architectures for the Viterbi Algorithm" 1990 IEEE IBM Research Division, Almaden Research Center, Univ. of Calif., Berkeley.

Seshadri et al, "Asymptotic Error Performance of Modulation Codes in the Presence of Severe Intersymbol Interference", IEEE Trans. on Info Theory vol. 34, No. 5 Sep. 1988.

Hagenauer "Rate-Compatible Punctured Convolutional Codes (RCPC Codes) and their Applications", IEEE Trans. on Comm. vol. 36 No. 4 Apr. 1988.

R. W. Wood, "Viterbi reception of Miller-squared code on a tape channel," Proc. 4th Int. Conf. Video and Data Recording, IERE Conf. Proc. 54, Southhampton, England, Apr. 1982, pp. 333-343.

R. Karabed and P. H. Siegel, "Matched spectral null codes for partial response channels," IEEE Trans. Info. Th., vol. 37, No. 3, pp. 818-855, May 1991.

E. Eleftheriou and R. Cideciyan, "Quaternary codes for patrial-response channels," Proc. 1990 IEEE Global Telecomm. Conf., San Diego, California, Dec. 1990, pp. 1673-1678.

Primary Examiner—Robert W. Beausoliel, Jr.
Assistant Examiner—Joseph E. Palys
Attorney, Agent, or Firm—Henry E. Otto, Jr.

[57] ABSTRACT

A method and apparatus for detecting spectral null sequences of a spectrally-constrained code on a noisy communications channel. From a Viterbi detector with a trellis structure comprising a plurality of states and edges, predetermined ones of the states and edges in the trellis structure are deleted at preselected times modulo N, such as times $\phi$ modulo N and/or at intermediate times m modulo N, where $m=\phi$, thereby to create a time-varying trellis structure for limiting the maximum length of dominant error events. The deleted edges are generally those edges which would have entered or emanated from the deleted states if they were not deleted. The trellis structure may be a so-called systolic structure, in which case the spectral null sequences are preferably DC-free or Nyquist free.

16 Claims, 6 Drawing Sheets

TIME-VARYING VITERBI DETECTOR FOR CONTROL OF ERROR EVENT LENGTH

CROSS REFERENCE TO RELATED APPLICATION

U.S. application Ser. No. 07/869,286, filed concurrently with this application, entitled "Time-Varying Modulo N Trellis Codes for Input Restricted Partial Response Channels."

FIELD OF THE INVENTION

This invention relates to a method and apparatus for detecting sequences of spectrallyconstrained codes on a noisy communications channel, and more particularly relates to a Viterbi detector with a time-varying trellis structure to significantly limit the maximum lengths of possible error events.

BACKGROUND OF THE INVENTION

The following references are considered to be the prior art most pertinent to the present invention:

[A] R. W. Wood, "Viterbi reception of Miller-squared code on a tape channel," Proc. 4th Int. Conf. Video and Data Recording, IERE Conf. Proc. 54, Southampton, England, Apr. 1982, pp. 333–343.

[B] R. Karabed and P. H. Siegel, "Matched spectral null trellis codes for partial response channels," U.S. Pat. No. 4,888,779, Dec. 19, 1989.

[C] R. Karabed and P. H. Siegel, "Matched spectral null codes for partial response channels," IEEE Trans. Info. Th , vol. 37, no. 3, pp. 818–855, May 1991.

[D] J. Rae and L. J. Fredrickson, "Systolic architecture for Viterbi detection of DC-free sequences," U.S. Ser. No. 07/776,142, filed Oct. 15, 1991.

[E] R. Karabed and P. H. Siegel, "Phase-invariant rate 8/10 matched spectral null code for PRML," allowed U.S. Ser. No. 07/747,401, filed Aug. 14, 1991, which is a continuation of U.S. Ser. No 07/434,970, filed Nov. 13, 1989 now abandoned.

[F] E. Eleftheriou and R. Cideciyan, "Quaternary codes for partial-response channels," Proc. 1990 IEEE Global Telecomm. Conf., San Diego, Calif., Dec. 1990, pp. 1673–1678.

Many communications applications utilize spectrally-constrained codes to generate spectral null sequences. The term spectral null sequences, as herein used, refers generically to codes having sequences With no spectral power or constant spectral power (i.e. a spectral density null with discrete spectral line) at certain frequencies, such as zero frequency (referred to as DC-free codes) or Nyquist frequency (referred to as Nyquist-free codes). Depending upon the application, these spectral null sequences can use symbols taken from any finite alphabet that is a subset of the complex numbers. The most common examples are integer-valued sequences with binary alphabet $\{0,1\}$, bipolar alphabet $\{+1,-1\}$, or quaternary alphabet $\{\pm 1, +3\}$.

Spectral null sequences can arise in the following ways, each relevant to this invention:

(1) Spectral null sequences (such as DC-free or Nyquist-free sequences) are represented by diagrams that reflect a bound on the accumulated charge or the running digital sums (see Reference [A]). These sequences are typically generated by a finite state machine, such as disclosed in Reference [B].

(2) Spectral null sequences can also be generated at the output of a sampled partial-response channel (typically represented as a digital filter) where the channel frequency response has a null at a particular frequency, such as also disclosed in Reference [B].

(3) The two approaches can be combined, as has been done in the context of matched-spectral-null coding for partial-response channels (see References [B] and [C]).

Spectral null sequences have been shown to have certain inherent distance properties that can improve the reliability of their recovery from data samples generated at the output of noisy communications channels. It has also been demonstrated that, at moderate-to-high signal-to-noise ratios, performance equivalent to that of a maximum-likelihood detector can be achieved by applying the algorithm executed by a Viterbi detector to a reduced-complexity trellis that tracks only the spectral content of sequences, as described in References [A], [B], and [C].

The likelihood of Viterbi detector error events decreases as a function of the sum of the squared errors, referred to as the "error distance." At moderate signal-to-noise ratios, the minimum (and next-minimum) distance error events are the most dominant. The existence of very long error events detracts from the system performance and implementation in several ways. Even with long path memory, the average error rate is degraded by survivor sequence truncation and larger error burst lengths.

The maximum length of such error events is determined by the parallel paths in the trellis that do not accumulate distance (referred to as "quasicatastrophic sequences"). In the context of trellis structures describing spectral null constraints, these sequences can be arbitrarily long. One solution to this problem was presented in References [B] and [C]; namely, the use of coding to impose constraints on the channel output sequences in order to prevent the occurrence of quasicatastrophic trellis sequences. This approach, although adequate in some instances, has two potential drawbacks in certain data storage applications. First, particularly for high-rate codes, the encoder and decoder functions may entail additional complexity. Second, the maximum length of dominant error events, although guaranteed to be bounded above by a fixed, finite number, may still be too long for a particular application.

Figure 1:
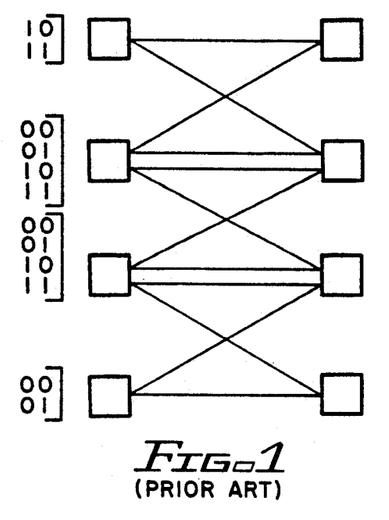
FIG. 1 is a schematic diagram of a prior art trellis structure with sequences of the accumulated charge or running digital sums (RDS) restricted to seven values as taught in Reference [B]

To illustrate these two points, reference is made to the rate 8/10 DC-free code, described in Reference [B]. That code was designed for use as a matched-spectral-null (MSN) code for a dicode (1-D) partial-response channel. Viewed as a code for a full response channel (i.e., a memoryless channel), the code doubles the minimum Hamming distance relative to the uncoded channel, providing a minimum Hamming distance of 2 instead of 1. The detector trellis for such an application is shown in FIG. 1. When the code is viewed as a MSN code and applied to a dicode partial-response channel, the detector uses the six-state trellis depicted in FIG. 2.

As noted in Reference [B], the high-rate 8/10 DC-free code does not avoid all quasicatastrophic sequences in the trellis structures. One approach to alleviating this problem was described in Reference [E], where a rate 8/10 DC-free code with acceptable complexity was designed to avoid quasicatastrophic sequences. The maximum length of minimum distance error events in that system could be as much as 42 bits. Next-minimum distance error events had a maximum length in excess of 70 bits. Further improvements from coding alone are either impossible or tend to drive the encoder/decoder hardware complexity to unacceptable levels.

SUMMARY OF THE INVENTION

A method and apparatus is described for detecting spectral null sequences of a spectrally-constrained code on a noisy communications channel. From a Viterbi detector with a trellis structure comprising a plurality of states and edges, predetermined ones of said states and edges in the trellis structure are removed in a preselected time-dependent pattern to create a time-varying trellis structure for limiting the maximum length of dominant error events. The removed states correspond to charge values at preselected times modulo N, such as times $\phi$ modulo N, or at predetermined times modulo N between times $\phi$ modulo N. These charge values may, but need not, be the highest and lowest charge values. The removed edges are generally those edges which would have entered or emanated from said removed states if they were not removed.

The trellis structure from which the states and edges are removed may be a so-called systolic structure. The spectral null sequences may be DC-free or Nyquist-free. For example, the spectrally-constrained code may be a rate 8/10 code, a rate 16/20 balanced code with a running digital sum (RDS) trellis structure, a rate 8/10 adjacent/non-adjacent code with a RDS trellis structure, or a rate 12/15 code having a spectral density null with a corresponding RDS trellis structure. Or, if preferred, the spectrally constrained code may be a quaternary code, with a RDS trellis structure, such as a rate 15B/10Q balanced code or a rate 8B/6Q adjacent/nonadjacent code.

DESCRIPTION OF THE PREFERRED EMBODIMENTS

A. Binary Codes

The following four embodiments of the invention are implemented with binary sequences:

I. (FIGS. 3, 4)

Figure 2:
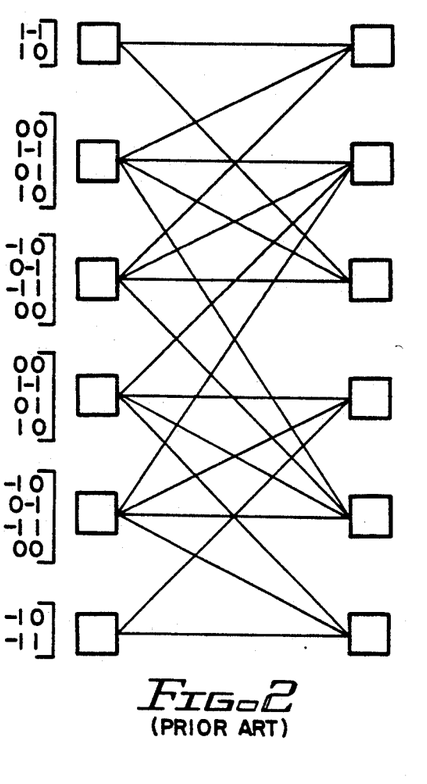
FIG. 2 is a schematic diagram of a prior art trellis structure with output sequences generated on a dicode (1-D) channel by the input sequences in FIG. 1.
Figure 3:
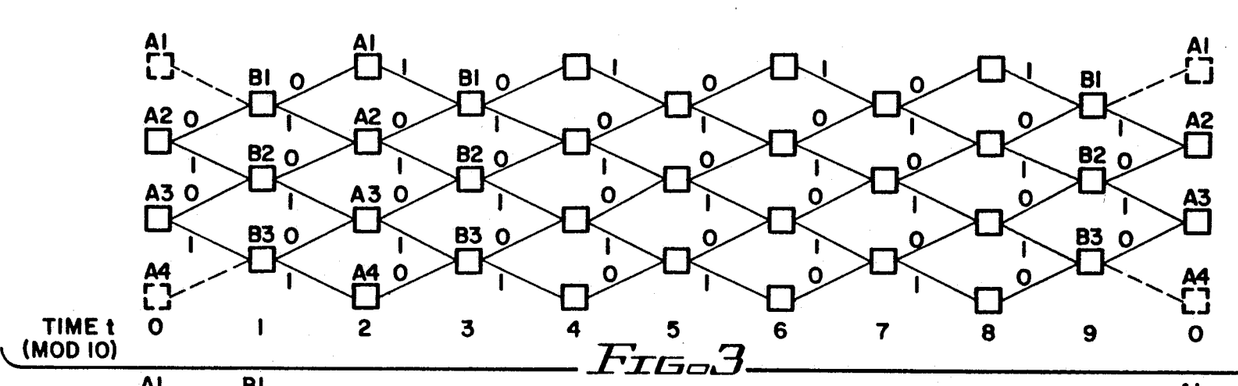
FIG. 3 is a schematic diagram of the trellis structure of FIG. 1 converted to a "systolic" representation, as taught by reference [D] and modified in accordance with the invention, to create a time-varying trellis by deleting the states and edges shown in dashed lines.
Figure 4:
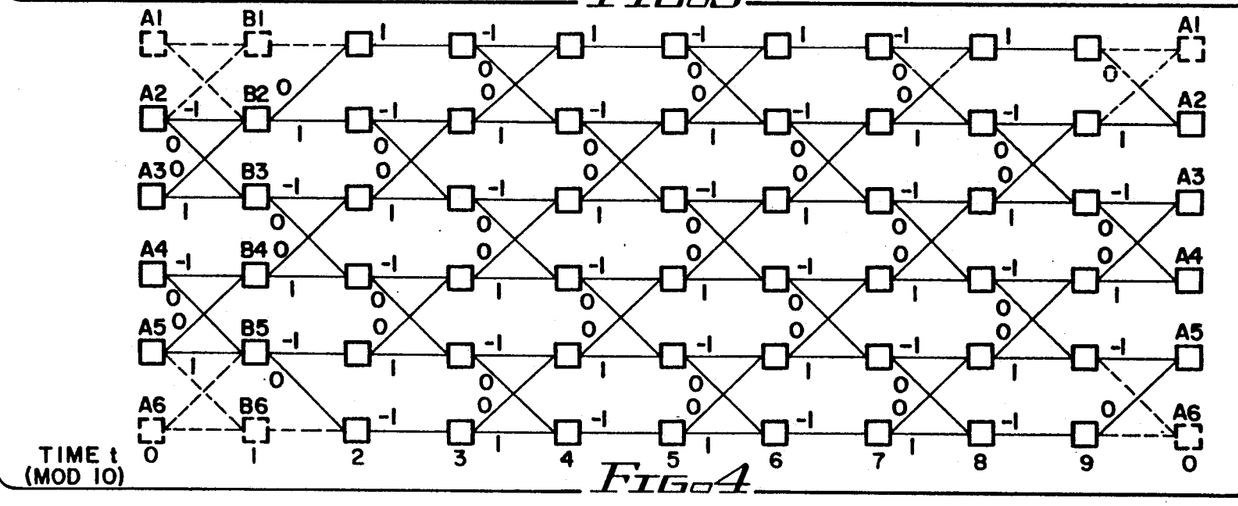
FIG. 4 is a schematic diagram of the trellis structure of FIG. 2 converted to a "systolic" representation, as taught by reference [D] and modified in accordance with the invention, to create a time-varying trellis by deleting the states and edges shown in dashed lines.

Assume initially that the prior art Viterbi detector trellis structures illustrated in FIG. 1 and 2 are converted, as shown in FIGS. 3 and 4 and taught in reference [D], periodically with the period 10 to corresponding systolic trellis representations that comprise 10 stages (0–9) which consist of the states and edges shown in both solid and dashed lines. The trellis structures of FIGS. 1 and 2, and also their systolic representations of FIGS. 3 and 4 can generate "quasicatastrophic" trellis sequences, as described and taught in Reference [B], which defined "quasicatastrophic" as those providing more than one path through the trellis.

According to the invention, the systolic trellis structures in FIGS. 3 and 4 are modified by deleting from these structures, at times $\phi$ modulo 10, the states and edges shown in dashed lines. More specifically, in FIG. 3, states A1 and A4 are deleted only at times $\phi$ modulo 10 (i.e., at stage $\phi$) as are the edges emanating from or leading to these states. However, the states B1, B2, B3 remain intact, as well as all states A1–A4 in the intervening stages 1 through 9. In FIG. 4, only at times $\phi$ modulo 10 states A1 and A6 are deleted as well as all edges from or to these deleted states; and, as a result, states B1 and B6 and the edges emanating therefrom are also deleted because no edges now lead thereto.

As illustrated in FIGS. 3 and 4, these deleted states correspond to the lowest and highest charge values. In both modified trellis structures, due to these modifications, the surviving sequences are forced to pass through one of the interior states every 10 samples. As a result, the trellis structure, as modified in FIG. 3, restricts the accumulated charge to two possible values every 10 bits; and the trellis structure, as modified in FIG. 4, provides a corresponding restriction at the output of a dicode (1-D) partial response channel.

Only a subset of the quasicatastrophic sequences generated by the prior art trellis structures shown in FIGS. 1 and 2 can be generated by the trellis structures, as modified. But this subset desirably does not include any of the sequences generated by the original rate 8/10 code described in Reference [B]. The same code can therefore be used with the modified trellises, now with the assurance that the maximum length of dominant error events is bounded; i.e. predetermined and fixed. The maximum length of minimum distance error events is desirably more limited than that obtained by the coding technique taught in Reference [E]. More specifically, the modified trellises of FIGS. 3 and 4 reduce the maximum length of any trellis sequence over which no distance is gained to no more than 26 bits, and the maximum length of minimum distance error events to no more than 30 bits.

II. (FIG. 5)

In this embodiment, the detector trellis for a DC-charge constraint, shown in systolic form in FIG. 4, is modified so as to force the supported sequences to a single RDS or charge state. Since the resulting trellis can generate no quasicatastrophic sequences, the length of minimum distance error events is limited to the length of the periodic variation.

Figure 5:
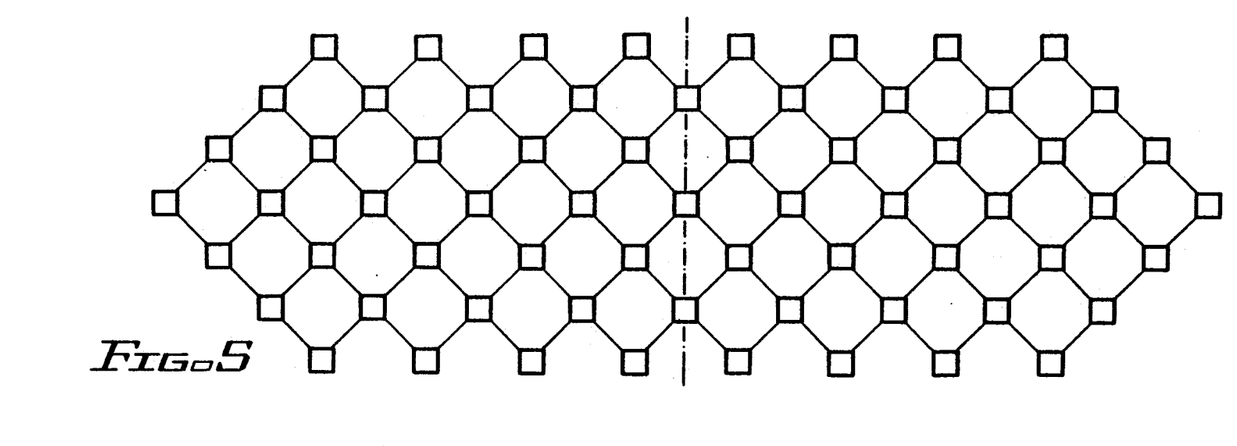
FIG. 5 is a schematic diagram of a running digital sum (RDS) trellis structure for a rate 16/20 balanced spectrally-constrained code.

A specific embodiment for a complete period-20 time-varying systolic trellis is shown in FIG. 5. Note that the portion of the trellis to the right of the vertical dashed line is a mirror image of the portion to the left of said line. This trellis supports several DC-free block codes with rate 16/20, and limits minimum distance error events to length 20. The trellis structure (not shown) for the coded-dicode detector is derived from FIG. 5 in the following manner, known in the art, and now very briefly described.

The coded-dicode trellis can be considered as having states described by pairs s,b, where s is a state in the diagram describing the code sequences and b is a symbol in the code alphabet. There will be a transition from state s,b to state s',b' only when there is an edge in the code state diagram from state s to state s' with edge label b'. The label on the edge in the coded-dicode trellis will be b'-b. As usual, if a state in the state diagram for the coded-dicode detector has no incoming edge, the state can be deleted. This technique applies to any trellis structure for use with a partial response channel, irrespective of whether the trellis is time-varying.

This trellis structure may be used to detect any subset of over 107,000 20-bit long sequences represented by paths through the trellis structure; a rate 16/20 would constitute the highest rate code and would enable selection of any specific subset of $2^{16}$ codewords.

Note that the code generated by this trellis structure is "balanced"; i.e., every sequence generated by a full period of the trellis has an equal number of zeroes and ones.

III. (FIG. 6)

In this embodiment, the charge state is constrained to two adjacent charge values at times $\phi$ modulo N and to two non-adjacent charge values at a specified time m modulo N, where m≠0.

Figure 6:
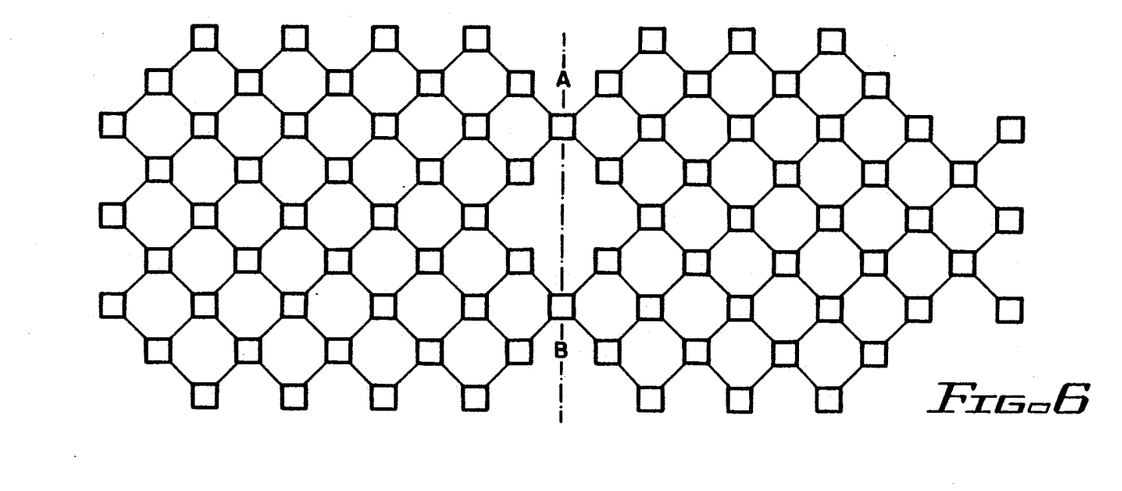
FIG. 6 is a schematic diagram of an RDS trellis structure for a rate 8/10 adjacent/nonadjacent spectrally-constrained code.

FIG. 6 illustrates a trellis, embodying such charge value restrictions, that can generate a rate 16/20 binary code. Note that, as illustrated, N=20 and m=10, with the result that the portion of the trellis structure to the right of the vertical broken line through states A and B is the mirror image of the portion to the left of said line. The code is designed so that the code sequences passing through the two intermediate states A and B at time 10 modulo 20 do not cross the dashed horizontal line shown in FIG. 6. If the code is applied to the dicode channel, and demodulated with the detector trellis that combines the channel memory as well as the charge constraints, the time variation in the trellis precludes long parallel paths and limits the length of minimum distance events to three bytes (24 bits).

Figure 7:
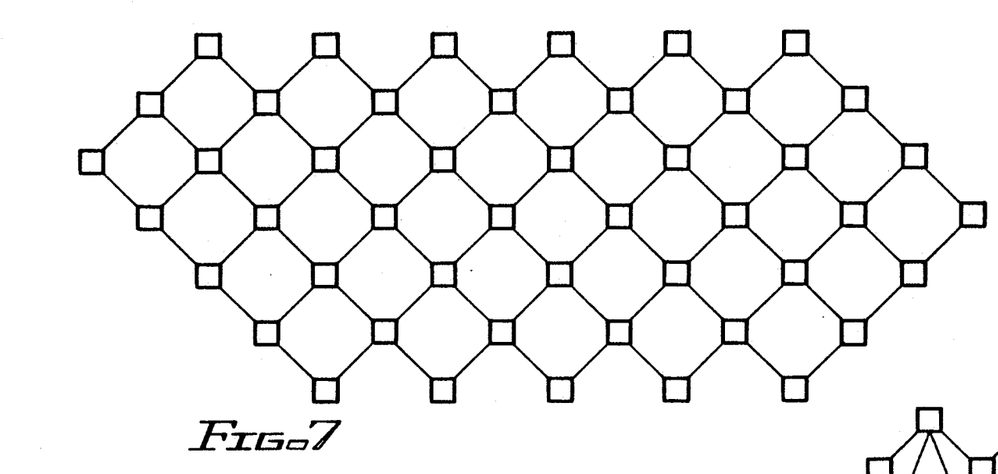
FIG. 7 is a schematic diagram of an RDS trellis structure for a rate 12/15 spectrally-constrained code having a spectral density null.

IV (FIG. 7)

This embodiment utilizes a charge-constraint trellis that supports a rate 12/15 binary code, where the code sequences accumulate a constant, nonzero running-digital-sum (RDS) every 15 symbols. The power spectrum of such a code has a null in the spectral density, but also a discrete spectral line at zero frequency. The distance properties of spectral null codes extend to such codes with spectral density nulls, as taught in Reference [C]. Again, since the trellis structure for the corresponding coded-dicode detector can be derived in the known manner briefly described in connection with FIG. 5, it has been omitted.

B. Quaternary Codes

The following two embodiments of the invention are implemented with quaternary sequences (i.e., sequences over the alphabet $\{\pm 1, \pm 3\}$).

Figure 8:
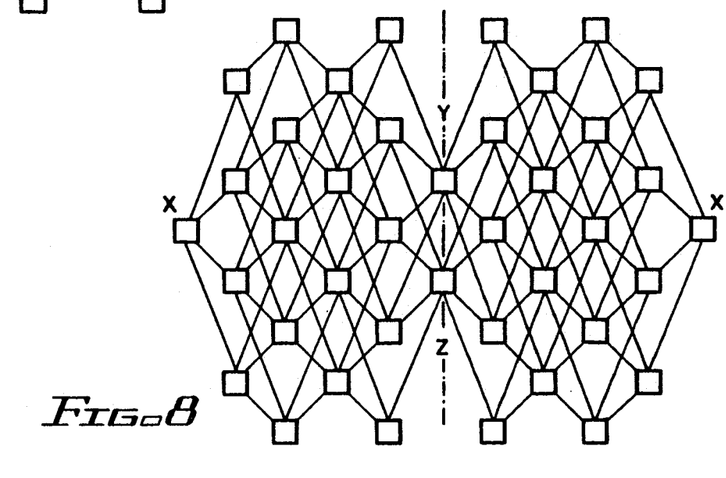
FIG. 8 is a schematic diagram of an RDS trellis structure for a rate 15B/10Q quaternary balanced spectrally-constrained code.

V (FIG. 8)

This trellis is the quaternary analogue of the binary-valued trellis structure in FIG. 5. The portion of the trellis structure to the right of the vertical broken line through states Y and Z is the mirror image of the portion to the left of said line.

This trellis structure generates a rate 15B/10Q balanced code in which the sequences all start and end at a fixed charge state. The trellis generates 129 sequences, 5 symbols in length, from state X to state Y, and also 129 complementary sequences that run from state X to state Z. Of these 258 sequences, 256 are used in code sequences and can be generated by a rate 8B/5Q encoder table. In the right portion of the trellis, the sequences from states Y and Z to X are formed by time reversal of those just discussed, so the 15B/10Q encoding can be completed by appropriate use of a rate 7B/5Q encoder table. This code structure obviously simplifies encoding.

Figure 9:
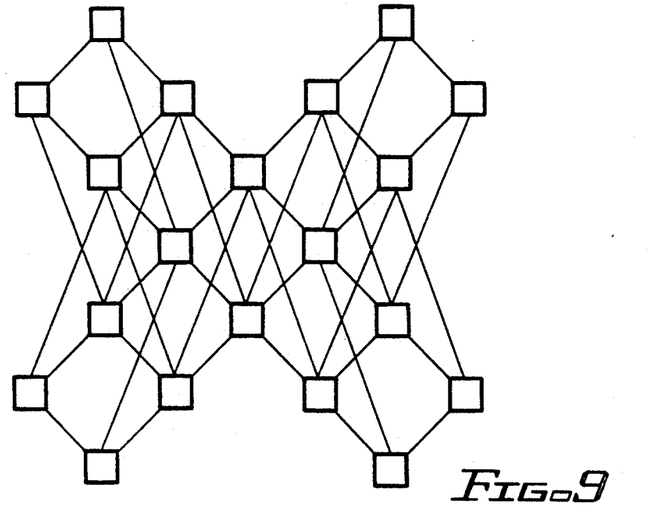
FIG. 9 is a schematic diagram of an RDS trellis structure for a rate 8B/6Q optimal adjacent/nonadjacent quaternary spectrally-constrained code.

VI (FIG. 9)

This quaternary charge-state trellis reflects the adjacent/non-adjacent charge-state structure found in the binary trellis in FIG. 6. It generates precisely the code sequences of a rate 8B/6Q code in which the allowed charge states after every three symbols alternate between adjacent and non-adjacent states.

In the quaternary embodiments, V and VI, the trellis structures for the corresponding coded partial-response channel detectors are directly deduced from the charge-state trellises shown in FIGS. 8 and 9, respectively.

The reduction in error event lengths arising from the application of the present invention to the design of quaternary codes for partial-response channels is best understood by comparing them to prior art codes published in Reference [F]. These prior art codes were intended for use in wire transmission, where the important considerations are minimal decoder delay (path memory) and simplicity of implementation. In such applications, the quaternary codes presented in embodiments V and VI of the present invention provide significant advantages over the prior art codes described in Reference [F]. Specifically, these prior art quaternary codes with rates 3/2 and 4/3 (embodied as rates 9B/6Q and 8B/6Q, respectively) require Viterbi path memory of 24 quaternary symbols. By contrast, applicants' rate 3/2 code (illustrated in embodiment V as rate 15B/10Q) requires only 15 symbols, and the rate 4/3 code (illustrated in embodiment VI as rate 8B/6Q) requires a path memory of only 9 symbols.

It is known that the probability of error for various codes varies primarily with minimum distance and required path memory. However, error coefficient is also a factor. Codes with smaller error coefficients tend to be slightly better in terms of error rate. Note the optimality and near-optimality of the error coefficients of the codes herein disclosed. The trellis for the rate 4/3 code (with rate 8B/6Q of embodiment VI, FIG. 9) generates only sequences that are used by the rate 8B/6Q code; and likewise for the corresponding coded-dicode detector trellis (not shown). This results in a minimal error coefficient for reduced probability of error events at moderate signal-to-noise ratios. The trellis for the rate 3/2 (i.e., 15B/10Q) code of embodiment V (FIG. 8) contains only one additional sequence beside the coded sequences in each five symbol period. This provides a similar advantageous reduction in the error coefficient.

Apparatus for Generating Time-Varying Trellis

Figure 10:
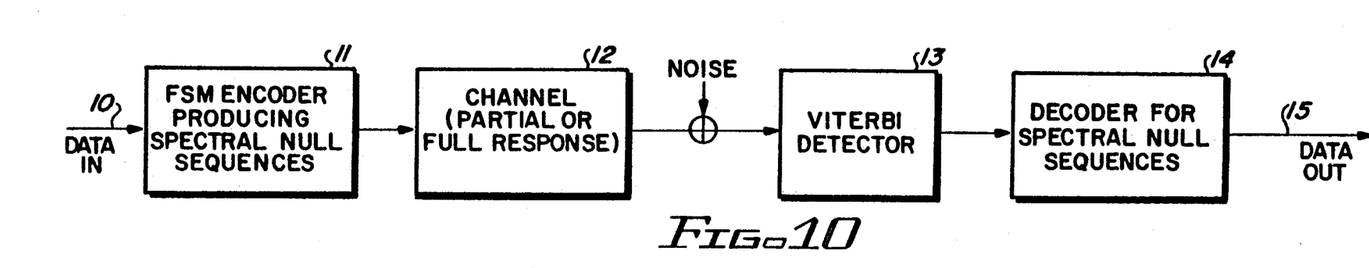
FIG. 10 is a block diagram of an apparatus embodying the invention.

As depicted in FIG. 10, input data, such as in the form o( binary symbol strings, is transmitted from a bus 10 to encoder 11. Encoder 11 is a finite state machine (FSM) that generates spectral null sequences that serve as input to a communications channel 12, such as a partial response channel or a full response channel. These spectral null sequences have a power spectrum of zero for each frequency at which there is a zero in the transfer function of the channel 12; i.e., the code sequences have spectral nulls which match those of the channel. A channel output sequence that is subject to noise is generated by channel 12 and detected at the channel output by a Viterbi detector 13 embodying the invention. This detector calculates the most probable code sequence from the channel output sequence. Detector 13 reduces computational and hardware requirements by tracking only the frequency spectral content of the channel output sequence, thereby producing a near maximum-likelihood estimate (or most probable code sequence) of the transmitted original data sequence supplied via bus 10. A sliding block decoder 14 in the form of a look up table or FSM decodes the matched spectral null sequences to provide, as an output, user data on bus 15.

Applicants' invention resides in the modified Viterbi detector 13 and in its combination with the encoder 11 and channel 12. The encoder 11, channel 12 and decoder 14 may be as described in the above-cited references, such as Reference [B].

Figure 11:
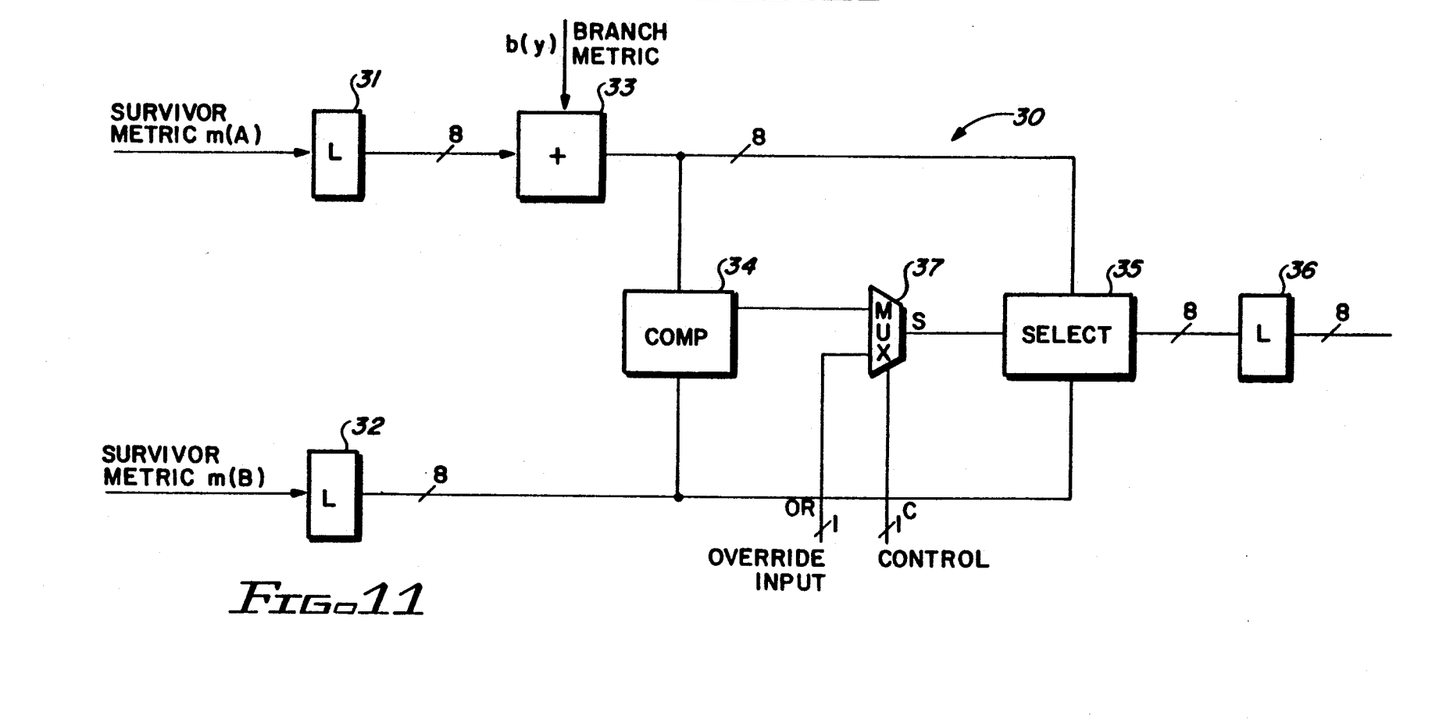
FIG. 11 is a schematic diagram of an add-compare-select (ACS) unit included in a Viterbi detector constituting part of the apparatus shown in FIG. 10.

Viterbi detector 13 comprises a plurality of add-compare-select (ACS) units 30 of the type illustrated in FIG. 11. Each unit 30 comprises latches 31,32, an adder 33, a comparator 34, a selector 35, a latch 36 and, according to the invention, a multiplexer 37 (MUX) interposed between the comparator 34 and selector 35.

The ACS units 30 implement the time variation in the systolic trellis structure shown in FIG. 4, which has at most two incoming edges per trellis state. Of these two, at most one incoming edge has a nonzero label. Let A denote a state from which an incoming edge with nonzero label emanates (if such an edge exists); and let B denote a state from which an edge with label $\phi$ emanates (again, if such an edge exists).

In operation, at any time t, survivor metric m(A) from state A is stored in latch 31, and the survivor metric m(B) from state B is stored in latch 32. Using a look-up table or a simple arithmetic processor (not shown), separate from the trellis structure, a branch metric b(y) is computed for an edge with nonzero label when a sample y is received at time t+1. Adder 33 adds branch metric b(y) and survivor metric m(A) for state A, generating m(A)+b(y). Comparator 34 outputs a value of $\phi$ or 1 according to whether m(A)+b(y) is smaller or larger than m(B). In a conventional ACS unit, this quantity would trigger selector 35 to store the smaller metric in latch 36. However, in the ACS unit 30, as modified according to the invention, MUX 37 is included, as earlier noted. MUX 37 has as inputs not only the single bit output of comparator 34 but also a single bit override signal from line OR. Operation of MUX 37 is controlled by a single bit control signal in line C. Signals in these control and override lines C and OR are generated by a FSM (not shown) as a function of the time step modulo N of the time-varying trellis structure. If the control signal in C has the value $\phi$, ACS unit 30 will operate as a conventional ACS unit. However, if the control signal in C is set to 1, MUX 37 will be activated and allow the FSM to override the comparator 34 and generate a specified input S to selector 35, and thereby cause a specified metric to be stored in latch 36. In this manner, ACS unit 30 embodying the invention generates the same metric that would be produced if one of the edges from A or B were deleted.

Table 1 is a truth table that describes all possible behaviors of ACS unit 30 as a function of the output of comparator 34, override signal in OR, and control signal in C. In this table the symbol $\phi$ is interpreted as a reference to the metric m(A)+b(y), and the symbol 1 is interpreted as a reference to the metric m(B). Note that if all incoming edges to a state are to be deleted at time t+1, the state-machine can use control and override signals at time t+2 to delete the outgoing edges from that state. This produces the same effect as eliminating the state at time t+1, but does not disrupt the add-compare-select recursion.

TABLE 1

| Comparator Output | OR Override Input | C Control | S |
|---|---|---|---|
| 0 | 0 | 0 | 0 |
| 0 | 1 | 0 | 0 |
| 1 | 0 | 0 | 1 |
| 1 | 1 | 0 | 1 |
| 0 | 0 | 1 | 0 |
| 0 | 1 | 1 | 1 |
| 1 | 0 | 1 | 0 |
| 1 | 1 | 1 | 1 |

It will now be seen that ACS unit 30 can be substituted for a conventional ACS unit in a spectrally-constrained detector trellis structure. One of the key benefits of the original reduced-complexity trellis structures (namely the small number of states and hence of ACS units) is retained. For example, the time-varying trellis structure in FIG. 3 nominally requires 33 separate ACS units to complete a full period of 10 time stages.

According to the invention, by use of the ACS unit 30 the number of required ACS units is reduced to the maximum number of states in use during any single time stage, which in the case of FIG. 3 is 4. Similarly, the period 10 trellis in FIG. 4 utilizes 56 ACS units. By contrast, use of ACS unit 30 reduces the number to only 6 units.

Figure 12:
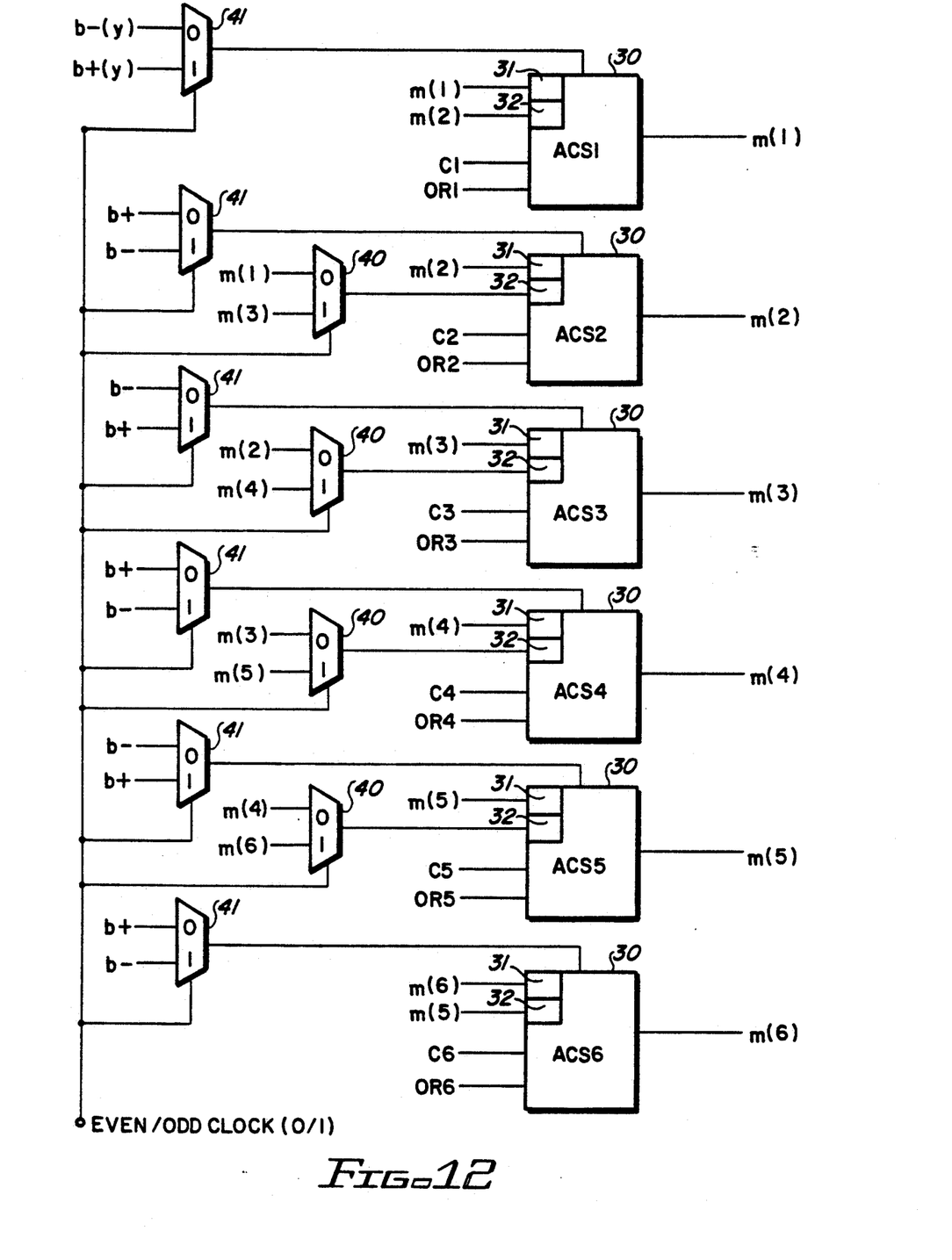
FIG. 12 is a schematic diagram of the circuitry, including ACS units, for implementing the time-varying trellis of FIG. 4.

FIG. 12 depicts circuitry, including ACS units 30 of FIG. 11 in combination with additional structure within the Viterbi detector 13, that implements the time-varying trellis of FIG. 4. This circuitry comprises six ACS units 30 for providing survivor metrics m(1)...m(6) which are generated at the outputs of processors A1, A2, ... , A6 at even time instants (t0,t2...t8) and at the outputs of processors B1,B2,..., B6 at odd time instants (t1,t3,...t9). These survivor metrics m(1)...m(6) correspond to the contents of latch 36 in each of the ACS units 30. The routing (feedback) of these survivor metrics to the inputs of the ACS units for the succeeding detector step is indicated by the survivor metric labels m(1)...m(6) on the input lines. Each of the ACS units 2, 3, 4, and 5 additionally use a two-way multiplexer 40 on one of the input lines to permit selection of the appropriate survivor metric at even and odd times, reflecting the differing survivor metric inputs indicated in FIG. 4 for processors A2, A3, A4, A5 and B2, B3, B4, B5. The survivor metrics m(1)...m(6) are fed to latches 31 and 32 in each ACS unit, as shown in FIG. 12.

Similarly, an appropriate branch metric b(y) for each ACS unit 30 at even and odd times is selected using a two-way multiplexer 41. The two possible branch metrics are denoted $b_+(y)$ and $b_-(y)$, corresponding to the edges in FIG. 4 with labels $+1$ and $-1$, respectively. These branch metrics would assume values corresponding to a prespecified function of each data sample at a specified time. In a preferred embodiment, these values would be $b_+(y)=-2y+1$ and $b_-(y)=2y+1$. The selected branch metric is then supplied to the adder 33 in each ACS unit 30. The override lines OR and control lines C to each ACS unit are designated in FIG. 12 as OR1, OR2, ..., OR6 and C1, C2, ... , C6, respectively, to more specially identify them.

Table 2 describes a finite-state-machine that supplies the requisite input signals to the override line OR, control line C, survivor metric multiplexer 40 and branch metric multiplexer 41 input of the six ACS units. These signals, which depend upon a preselected time instant modulo 10, ensure that the simplified apparatus reproduces the behavior of the time-varying trellis depicted in FIG. 4.

than 2, would require an N-way MUX (instead of 2-way MUX 37 of FIG. 11) to provide time-varying edge selection and deletion. At most $1+\log_2 N$ signal lines (1 bit for the control input C and $\log_2 N$ bits for the override input OR) would be required to achieve complete control on the output selection, where $\log_2 N$ is the smallest integer greater than or equal to $\log_2 N$.

Also, if preferred, the MUX function implemented by MUX 37 need not be implemented separately, but could be combined with either the comparator 34 or the select block 35, or both, to achieve advantages related to the speed of operation and the required hardware.

While the invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the claims.

We claim:

1. A method for detecting spectral null sequences of a spectrally-constrained code, comprising the steps of:
    using an encoder, generating the spectral null sequences from digital electrical signals representing unencoded input data;
    transmitting the sequences from the encoder to a partial response channel subject to noise; and
    transmitting the sequences from the channel to a Viterbi detector with a trellis structure with a plurality of states and edges from which predetermined ones of said states and edges in the trellis structure are absent in the preselected time-dependent pattern to create a time-varying trellis structure for limiting the maximum length of dominant error events in said sequences;
    at least some of the absent states and edges corresponding to a lowest and a highest charge value occurring at preselected times modulo N.

2. The method of claim 1, wherein the trellis structure comprises a plurality of stages, the number of which

TABLE 2

| Time t modulo 10 | C1 | C2 | C3 | C4 | C5 | C6 | OR1 | OR2 | OR3 | OR4 | OR5 | OR6 |
|---|---|---|---|---|---|---|---|---|---|---|---|---|
| 1 | X | 0 | 0 | 0 | 0 | X | X | X | X | X | X | X |
| 2 | 1 | 1 | 0 | 0 | 1 | 1 | 0 | 1 | X | X | 1 | 0 |
| 3 | 1 | 0 | 0 | 0 | 0 | 1 | 1 | X | X | X | X | 1 |
| 4 | 0 | 0 | 0 | 0 | 0 | 0 | X | X | X | X | X | X |
| 5 | 1 | 0 | 0 | 0 | 0 | 1 | 1 | X | X | X | X | 1 |
| 6 | 0 | 0 | 0 | 0 | 0 | 0 | X | X | X | X | X | X |
| 7 | 1 | 0 | 0 | 0 | 0 | 1 | 1 | X | X | X | X | 1 |
| 8 | 0 | 0 | 0 | 0 | 0 | 0 | X | X | X | X | X | X |
| 9 | 1 | 0 | 0 | 0 | 0 | 1 | 1 | X | X | X | X | 1 |
| 0 | X | 0 | 0 | 0 | 0 | X | X | X | X | X | X | X |

Ci = 0 ==> Natural selection
1 ==> Forced selection
X ==> Don't care
Ori = 0 ==> Select diagonal branch
1 ==> Select horizontal branch
X ==> Don't care While FIG. 11 depicts the ACS unit 30, as modified for a systolic trellis structure like that of FIG. 4, an appropriate ACS unit introducing time variation in other trellis structures can readily be derived from ACS unit 30, bearing in mind that the specific configuration of the unit will depend upon the maximum number of edges entering a trellis node or state.

Moreover, implementations in which the maximum number of inputs to an ACS unit is N, where N is larger determines the periodicity of the trellis structure, and wherein at least some of the absent states and edges are absent from the first and last stages of the trellis structure.

3. The method of claim 2, wherein said stages include at least one stage between said first and last stages from which are also absent predetermined other states together with edges entering or emanating therefrom.

4. The method of claim 1, wherein the sequences are DC-free.

5. The method of claim 1, wherein the sequences are Nyquist-free.

6. The method of claim 1, wherein the code is a rate 16/20 balanced spectrally-constrained code.

7. The method of claim 1, wherein the code is a rate 8/10 adjacent/nonadjacent spectrally-constrained code.

8. The method of claim 1, wherein the code is a rate 12/15 spectrally-constrained code having a spectral density null.

9. The method of claim 1, wherein the code is a rate 15B/10Q quarternary balanced spectral code having a spectral density null.

10. The method of claim 1, wherein the code is a rate 8B/6Q optimal adjacent/nonadjacent quaternary spectrally-constrained code.

11. A method for detecting spectral null sequences of a spectrally-constrained code from data samples in the form of digital electrical signals generated at the output of a noisy communications channel, comprising the steps of:

providing a Viterbi detector that tracks the spectral content of said sequences of electrical signals with a trellis structure having N stages, each comprising a plurality of states and edges; and deleting states corresponding to a lowest and a highest charge value and also all edges entering or emanating from the deleted states from the trellis structure at preselected times modulo N to create a time-varying trellis structure for limiting the maximum length of dominant error events in said sequences.

12. The method of claim 11, wherein the trellis structure form which the states and edges are deleted during the deleting step is a systolic structure.

13. An apparatus for detecting spectral null sequences of a spectrally-constrained code generated from unencoded input data, comprising:

a finite state machine for generating the spectral null sequences from the input data;

a Viterbi detector for tracing spectral content of said sequences with a trellis structure having N stages, each comprising plurality of states and edges; and means for deleting from the trellis structure states corresponding to a lowest and highest charge value and edges corresponding to those entering or emanating from the deleted states at preselected times modulo N to create a time-varying trellis structure for limiting the maximum length of dominant error events in said sequences.

14. An apparatus for detecting spectral null sequences of a spectrally constrained code from data samples generated at the output of a noisy communications channel, comprising a Viterbi detector having a trellis structure comprising a plurality of states and edges; and means for removing predetermined ones of said states and edges in a preselected time-dependent pattern to limit the maximum length of dominant error events, said means including a plurality of add-compare-select (ACS) units, one for each said state, each unit having as inputs at least one survivor metric that corresponds to an edge terminating at a predetermined one of said states and is output by a preceding one of the ACS units, each ACS unit also having a control input and an override input for selectively deleting selectable ones of said survivor metrics and hence their corresponding edges.

15. The apparatus of claim 14, including means for providing a branch metric input for each survivor metric that is input to a particular one of the ACS units, each branch metric being a prespecified function of each data sample;

mean for adding the branch metric and corresponding metric inputs to provide a plurality of sums; and means for selecting as the survivor metric the smallest one of the sums in a subset determined by the control input and override input.

16. The apparatus of claim 14, wherein said control input and override input effect the selective deletion of the selectable ones of the survivor metrics at preselected times modulo N.

* * * * *